US008855161B2

(12) United States Patent
Motoda

(10) Patent No.: US 8,855,161 B2
(45) Date of Patent: Oct. 7, 2014

(54) SEMICONDUCTOR LASER DEVICE, METHOD OF MANUFACTURING SEMICONDUCTOR LASER DEVICE, AND SEMICONDUCTOR LASER ARRAY

(71) Applicant: Takashi Motoda, Tokyo (JP)

(72) Inventor: Takashi Motoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 13/748,664

(22) Filed: Jan. 24, 2013

(65) Prior Publication Data
US 2013/0243025 A1  Sep. 19, 2013

(30) Foreign Application Priority Data
Mar. 16, 2012 (JP) .................. 2012-060365

(51) Int. Cl.
*H01S 5/00* (2006.01)

(52) U.S. Cl.
USPC .................................. 372/50.124

(58) Field of Classification Search
CPC ....... H01S 5/34333; H01S 5/42; H01S 5/423; H01S 5/426; H01S 5/40; H01S 5/4025; H01S 5/2202; H01S 5/02461; H01S 5/1014
USPC ................. 372/50.12, 50.121, 21, 50.124, 66
See application file for complete search history.

(56) References Cited

U.S. PATENT DOCUMENTS

| 4,870,652 | A | 9/1989 | Thornton |
| 7,700,955 | B2 * | 4/2010 | Kuwata et al. .................. 257/79 |
| 8,022,424 | B2 * | 9/2011 | Masui et al. ..................... 257/98 |
| 2007/0009001 | A1 | 1/2007 | Shigihara et al. |
| 2007/0025406 | A1 * | 2/2007 | Yamada et al. .......... 372/50.121 |
| 2008/0317082 | A1 | 12/2008 | Inenaga |
| 2010/0284433 | A1 * | 11/2010 | Hata et al. ................ 372/45.011 |
| 2010/0329295 | A1 * | 12/2010 | Nakashima et al. ..... 372/46.012 |

FOREIGN PATENT DOCUMENTS

| JP | 2-39583 | A | | 2/1990 |
| JP | 3-76188 | A | | 4/1991 |
| JP | 2003-31905 | | * 1/2003 | ............... H01S 5/22 |
| JP | 2003-31905 | A | | 1/2003 |
| JP | 2004-233885 | A | | 8/2004 |
| JP | 2007-49109 | A | | 2/2007 |
| JP | 2008-130664 | A | | 6/2008 |
| JP | 2009-4473 | A | | 1/2009 |

* cited by examiner

*Primary Examiner* — Tuan Nguyen

(74) *Attorney, Agent, or Firm* — Leydig, Voit & Mayer, Ltd.

(57) ABSTRACT

A semiconductor laser device includes a substrate, ridge stripes on the substrate and separated by separation sections, a top surface electrode continuously extending over the ridge stripes, and a bottom surface electrode on a bottom surface of the substrate. Each of the ridge stripes includes a lower cladding layer on the substrate, an active layer on the lower cladding layer, an upper cladding layer on the active layer, and a contact layer on the upper cladding layer.

6 Claims, 9 Drawing Sheets

Comparative Example

Comparative Example

SEMICONDUCTOR LASER DEVICE, METHOD OF MANUFACTURING SEMICONDUCTOR LASER DEVICE, AND SEMICONDUCTOR LASER ARRAY

BACKGROUND OF THE INVENTION

1. Field of the Invention

The present invention relates to a semiconductor laser device, a method of manufacturing a semiconductor laser device, and a semiconductor laser array for use, e.g., in light sources for communications and for information processing devices.

2. Background Art

Japanese Laid-Open Patent Publication No. 2003-031905 discloses a multibeam semiconductor laser device having a plurality of semiconductor laser devices, wherein a voltage is applied between the top and bottom surface electrodes of each semiconductor laser device so that a laser beam is emitted from an end face of the semiconductor laser device.

The semiconductor laser device disclosed in the above publication is disadvantageous in that if a portion of an end face of the semiconductor laser device has been degraded due to COD, etc., degradation may spread from that portion to the rest of the end face. If the end face has been entirely degraded, then the semiconductor laser device is substantially prevented from outputting any optical power.

SUMMARY OF THE INVENTION

The present invention has been made to solve the foregoing problems. It is, therefore, an object of the present invention to provide a semiconductor laser device, a method of manufacturing a semiconductor laser device, and a semiconductor laser array, capable of preventing degradation from spreading from a degraded portion (if any) of an end face of the semiconductor laser device to the rest of the end face.

The features and advantages of the present invention may be summarized as follows.

According to one aspect of the present invention, a semiconductor laser device includes a substrate, a plurality of ridge stripes formed on the substrate and separated by separation sections, a top surface electrode formed to continuously extend over the plurality of ridge stripes, and a bottom surface electrode formed on a bottom surface of the substrate. Each of the plurality of ridge stripes includes a lower cladding layer formed on the substrate, an active layer formed on the lower cladding layer, an upper cladding layer formed on the active layer, and a contact layer formed on the upper cladding layer.

According to another aspect of the present invention, a method of manufacturing a semiconductor laser device includes the steps of forming a plurality of stripe-shaped selective growth films on a substrate, selectively growing lower cladding layers on the surface of the substrate in areas where the selective growth films have not been formed, forming active layers on the lower cladding layers, forming upper cladding layers on the top and sides of the active layers and on sides of the lower cladding layers and then forming contact layers on the upper cladding layers in such a manner as to form a plurality of ridge stripes, each including a lower cladding layer, an active layer on the lower cladding layer, an upper cladding layer on the active layer, and a contact layer on the upper cladding layer, forming an insulating film which covers sides of each ridge stripe and exposes the contact layer of each ridge stripe, and forming a top surface electrode which is in contact with the contact layer of each ridge stripe and the insulating film and which continuously extends to fill the spaces between the plurality of ridge stripes.

According to another aspect of the present invention, a semiconductor laser array includes a substrate, a first semiconductor laser device including a plurality of first ridge stripes formed on the substrate and separated by first separation sections, a first top surface electrode formed to continuously extend over the plurality of first ridge stripes, and a first bottom surface electrode formed on a bottom surface of the substrate directly below the first top surface electrode, and a second semiconductor laser device including a plurality of second ridge stripes formed on the substrate and separated by second separation sections, a second top surface electrode formed to continuously extend over the plurality of second ridge stripes, and a second bottom surface electrode formed on the bottom surface of the substrate directly below the second top surface electrode.

Other and further objects, features and advantages of the invention will appear more fully from the following description.

DETAILED DESCRIPTION OF THE PREFERRED EMBODIMENTS

First Embodiment

Figure 1:
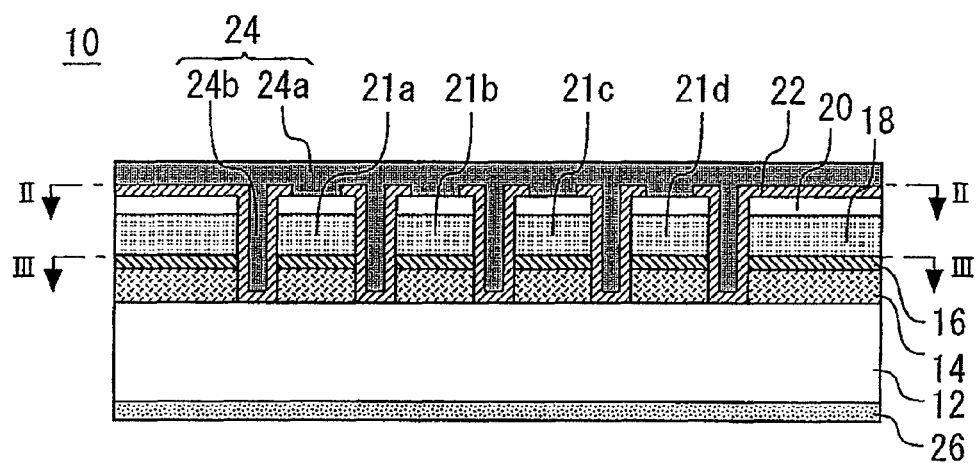
FIG. 1 is an elevational view of a semiconductor laser device in accordance with a first embodiment of the present invention.

FIG. 1 is an elevational view of a semiconductor laser device in accordance with a first embodiment of the present invention. The semiconductor laser device 10 includes a substrate 12. A plurality of lower cladding layers 14 are formed on the substrate 12. A plurality of active layers 16 are each formed on one of the lower cladding layers 14. A plurality of upper cladding layers 18 are each formed on one of the active layers 16. A plurality of contact layers 20 are each formed on one of the upper cladding layers 18.

A plurality of ridge stripes 21a, 21b, 21c, and 21d are formed in the semiconductor laser device 10. Each of these ridge stripes 21a, 12b, 21c, and 21d includes a lower cladding layer 14, an active layer 16 on the lower cladding layer 14, an upper cladding layer 18 on the active layer 16, and a contact layer 20 on the upper cladding layer 18. An insulating film 22 is formed to cover the ridge stripes 21a, 21b, 21c, and 21d in such a manner as to expose their contact layers 20.

A top surface electrode 24 is formed in contact with the contact layers 20. The top surface electrode 24 is made up of a top surface portion 24a and inter-ridge portions 24b which are integrally formed with each other. The top surface portion 24a continuously extends over the ridge stripes 21a, 21b, 21c, and 21d. The inter-ridge portions 24b, which constitute portions of the top surface electrode 24, are in contact with the insulating film 22 and fill the spaces between adjacent ridge stripes (21a, 21b, 21c, 21d).

Each two adjacent ridge stripes (21a, 21b, 21c, 21d) are separated by a separation section formed by the combination of the inter-ridge portion 24b between the two adjacent ridge stripes and the insulating film 22 on the facing sides of the two adjacent ridge stripes. It should be noted that the width of the separation sections may be, but is not limited to, 1 µm.

A bottom surface electrode 26 is formed on the bottom surface of the substrate 12. Thus, the semiconductor laser device 10 of the first embodiment has the ridge stripes 12a, 21b, 21c, and 21d, which are formed on the substrate 12 and separated by the separation sections. In the operation of the semiconductor laser device 10, a voltage is applied between the top surface electrode 24 and the bottom surface electrode 26 so that a laser beam is emitted from the active layers 16.

Figure 2:
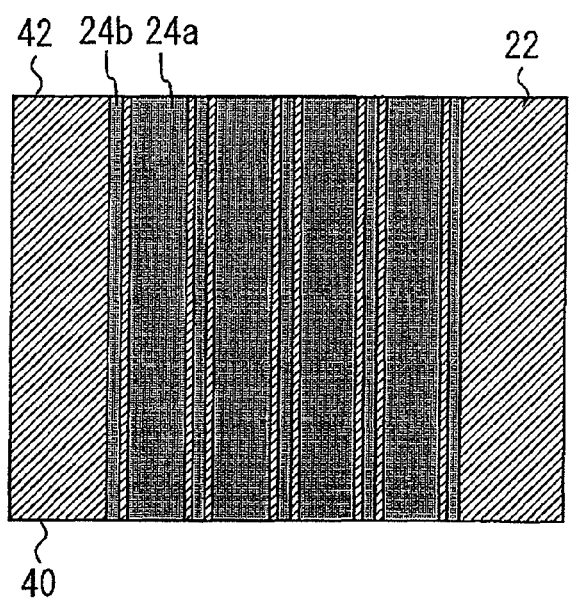
FIG. 2 is a cross-sectional view taken along dashed line II-II of FIG. 1 and viewed in the direction of the arrows.
Figure 3:
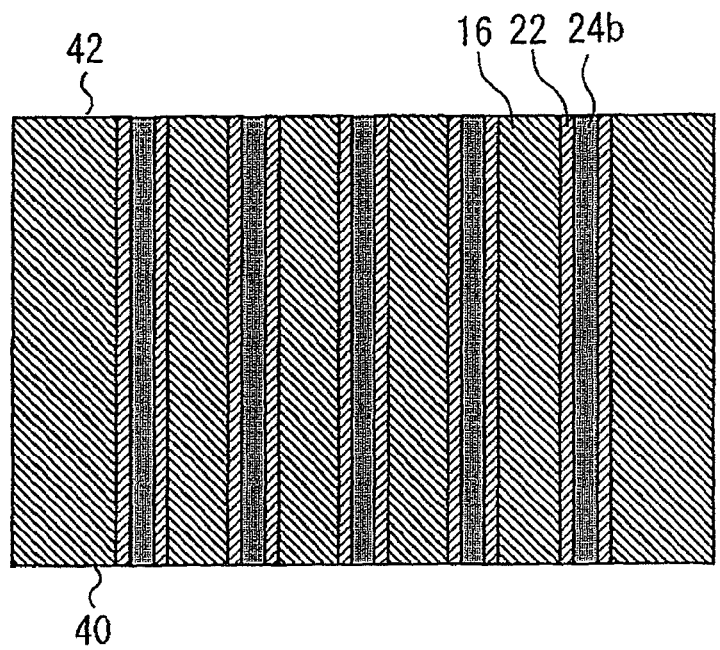
FIG. 3 is a cross-sectional view taken along dashed line III-III of FIG. 1 and viewed in the direction of the arrows.

FIG. 2 is a cross-sectional view taken along dashed line II-II of FIG. 1 and viewed in the direction of the arrows. The semiconductor laser device 10 has a front end face 40 and a rear end face 42. As can be seen from FIG. 2, the ridge stripes extend from the front end face 40 to the rear end face 42. FIG. 3 is a cross-sectional view taken along dashed line III-III of FIG. 1 and viewed in the direction of the arrows. The active layers 16 together form a plurality of stripes, as viewed in plan. Each two adjacent stripes are separated by a separation section (including a portion of the insulating film 22 and an inter-ridge portion 24b). Although in the first embodiment the end faces of the semiconductor laser device 10 have no coating formed thereon, in other embodiments a coating may be formed on each end face.

The following description will be directed to a method of manufacturing a semiconductor laser device in accordance with the first embodiment. The method begins by forming a lower cladding layer, an active layer, an upper cladding layer, and a contact layer over the substrate 12 in the order named. In this step, a band discontinuity reduction layer may be formed as necessary. Next, the contact layer, the upper cladding layer, the active layer, and the lower cladding layer are etched into stripes, thus forming ridge strips 21a, 21b, 21c, and 21d. It should be noted that adjacent ridge strips are separated by grooves at this stage.

An insulating film is then formed over the entire surface of the device. The formed insulating film also covers the sides of the ridge stripes 21a, 21b, 21c, and 21d and the bottom surfaces of the grooves. Next, the portions of the insulating film on the ridge stripes are removed to expose the contact layer 20 at each ridge stripe. A top surface electrode 24 is then formed. The top surface electrode 24 includes a top surface portion 24a, which extends over the contact layers 20, and inter-ridge portions 24b, which fill the grooves. It should be noted that the above etching for forming the ridge stripes 21a, 21b, 21c, and 21d may be stopped when a depth halfway through the lower cladding layer has been reached, or alternatively the lower cladding layer may not be etched, since the purpose of this etching is to divide the active layer into a plurality of stripes. An etching stopper layer may be used in order to leave the lower cladding layer unetched.

Figure 4:
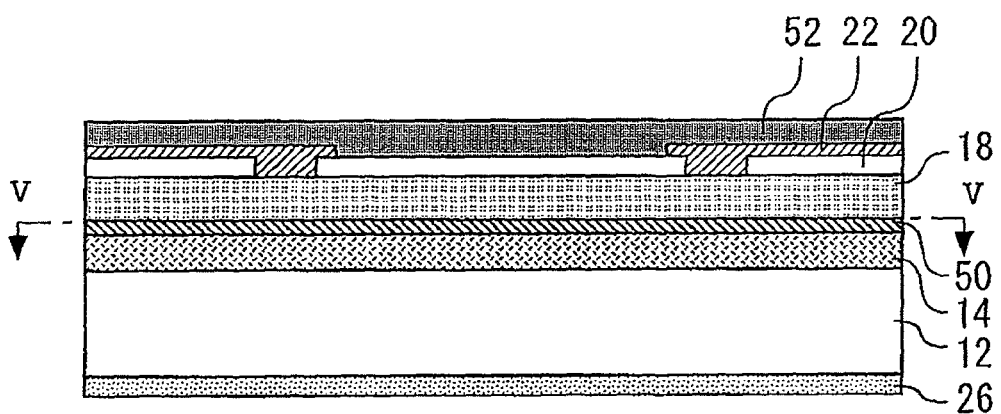
FIG. 4 is an elevational view of a comparative semiconductor laser device, which is presented for comparison purposes.

Before describing the advantages of the semiconductor laser device 10 of the first embodiment, and to facilitate the understanding thereof, the following description will be directed to a comparative example. FIG. 4 is an elevational view of a comparative semiconductor laser device, which is presented for comparison purposes. The active layer 50 of this semiconductor laser device has a single wide stripe structure, that is, the active layer 50 forms a single wide stripe extending across the entire surface of the device. The width of the active layer 50 is, e.g., 40 µm. The top surface electrode 52 of this semiconductor laser device is formed to be flat and does not have inter-ridge portions.

Figure 5:
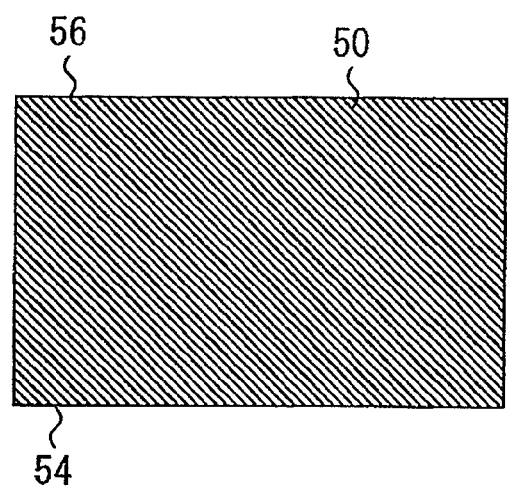
FIG. 5 is a cross-sectional view taken along dashed line V-V of FIG. 4 and viewed in the direction of the arrows.

FIG. 5 is a cross-sectional view taken along dashed line V-V of FIG. 4 and viewed in the direction of the arrows. As shown, the active layer 50 extends from the front end face 54 to the rear end face 56 of the semiconductor laser device. When this semiconductor laser device is operated at high output power levels, a portion of one of the end faces may be degraded due to COD, etc. If this occurs, degradation will spread from the degraded portion of the end face to the rest of the end face, that is, the entire emitting region will be degraded. This substantially prevents the semiconductor laser device from outputting any optical power.

In the semiconductor laser device 10 of the first embodiment, on the other hand, adjacent ridge strips (21a, 21b, 21c, 21d) are separated by separation sections (each including a portion of the insulating film 22 and an inter-ridge portion 24b). Therefore, even if an end face of one ridge stripe has been degraded, it is possible to prevent degradation from spreading from the degraded end face to end faces of other ridge stripes. For example, let it be assumed that an end face of the ridge stripe 21a has been degraded. In this case, degradation does not spread from the degraded end face of the ridge stripe 21a to the adjacent end face of the ridge stripe 21b, since these ridge stripes are separated by a separation section. Therefore, it is possible to prevent degradation from spreading from a degraded portion (if any) of an end face of the semiconductor laser device 10 to the rest of the end face.

If it is desired that the operating current of the semiconductor laser device 10 be equal to that of the above comparative semiconductor laser device being compared, it is only necessary to adjust the widths of the ridge stripes 21a, 21b, 21c, and 21d. Since the width of the active layer 50 of the above comparative semiconductor laser device is 40 µm, the width of each of the ridge stripes 21a, 21b, 21c, and 21d of the semiconductor laser device 10 may be selected to be 10 µm so that the sum of the widths of the light-emitting active layers, or the ridge stripes, of the semiconductor laser device 10 is equal to the width of the active layer 50 of the comparative semiconductor laser device. Thus, the construction of the semiconductor laser device 10 can prevent degradation from spreading from a degraded portion (if any) of an end face of the device to the rest of the end face, while maintaining the operating current of the semiconductor laser device 10 at the same level as the operating current of comparative semiconductor laser devices.

Further, since the inter-ridge portions 24b are in contact with the insulating film 22, which in turn is in contact with the active layers 16, the heat generated from the active layers 16 can be transferred out of the semiconductor laser device through the inter-ridge portions 24b and the top surface portion 24a of the top surface electrode 24, resulting in improved heat dissipation from the semiconductor laser device 10.

In the first embodiment, the separation sections which separate the active layers 16 are formed of the insulating film 22 and portions of the top surface electrode 24. However, the separation sections may be suitably differently configured. For example, the inter-ridge portions of the top surface electrode 24 may be formed of material having higher heat dissipation properties than those of the top surface portion of the top surface electrode 24.

Figure 6:
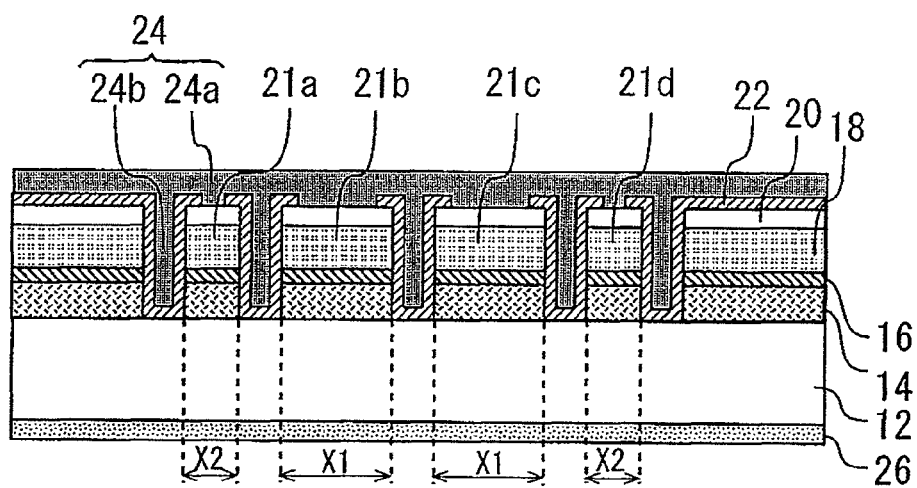
FIG. 6 is an elevational view of a variation of the semiconductor laser device of the first embodiment.

FIG. 6 is an elevational view of a variation of the semiconductor laser device of the first embodiment. In this semiconductor laser device, the width (X1) of the central ridge stripes 21b and 21c (among the plurality of ridge stripes 21a, 21b, 21c, and 21d) is greater than the width (X2) of the outermost ridge stripes 21a and 21d. Since wide semiconductor laser devices, such as this semiconductor laser device, have a wide emitting region (a few tens of microns wide), the heat generated from the central portion of the emitting region when these semiconductor laser devices lase is greater than that generated from the other portions of the emitting region. In this semiconductor laser device, however, the central ridge stripes have a greater width than the other ridge stripes, which improves the heat dissipation from the central ridge stripes.

Figure 7:
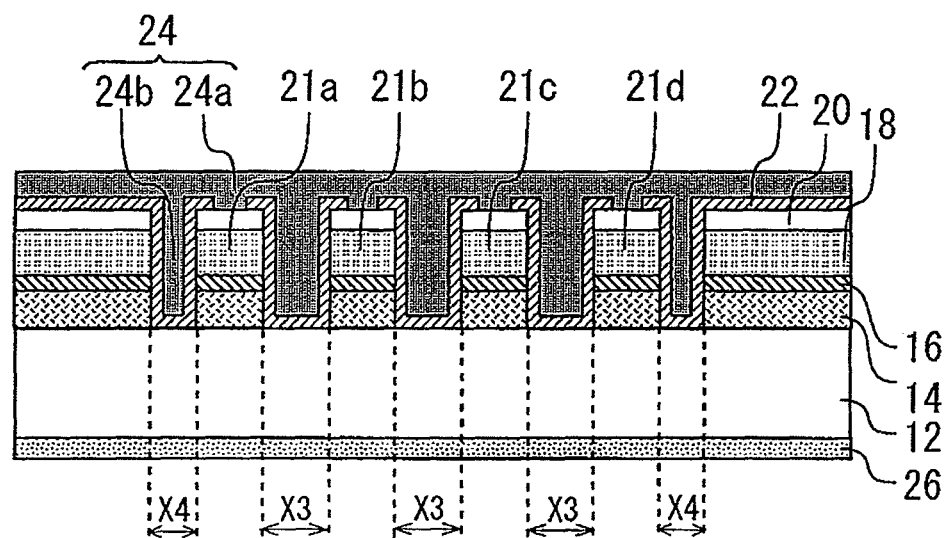
FIG. 7 is an elevational view of another variation of the semiconductor laser device of the first embodiment.

FIG. 7 is an elevational view of another variation of the semiconductor laser device of the first embodiment. In this semiconductor laser device, the width (X3) of the three central separation sections is greater than the width (X4) of the outermost separation sections. This improves the heat dissipation from the central ridge stripes 21b and 21c.

Figure 8:
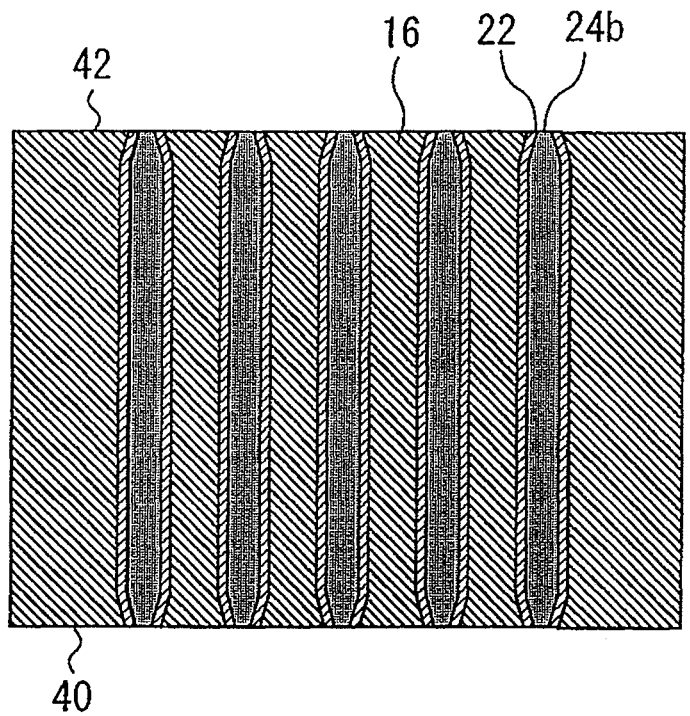
FIG. 8 is a plan view of the active layers of still another variation of the semiconductor laser device of the first embodiment.

FIG. 8 is a plan view of the active layers of still another variation of the semiconductor laser device of the first embodiment. The ridge stripes of this semiconductor laser device have a different shape in plan than the ridge stripes of the semiconductor laser device of the first embodiment. Specifically, each ridge stripe is formed in such a manner that its width as viewed in plan is greatest at both ends. Thus, the width of both end portions of each ridge stripe is greater than the width of the central portion of the ridge stripe, that is, each ridge stripe is a flare stripe, so that the beam is spread at both end portions.

The top surface electrode 24 (p-side electrode) and the bottom surface electrode 26 (n-side electrode) may be made of gold, platinum, titanium, molybdenum, tantalum, or nickel, or a multilayer thereof. Further, the top surface electrode 24 and the bottom surface electrode 26 may be plated with gold, etc.

Second Embodiment

Figure 9:
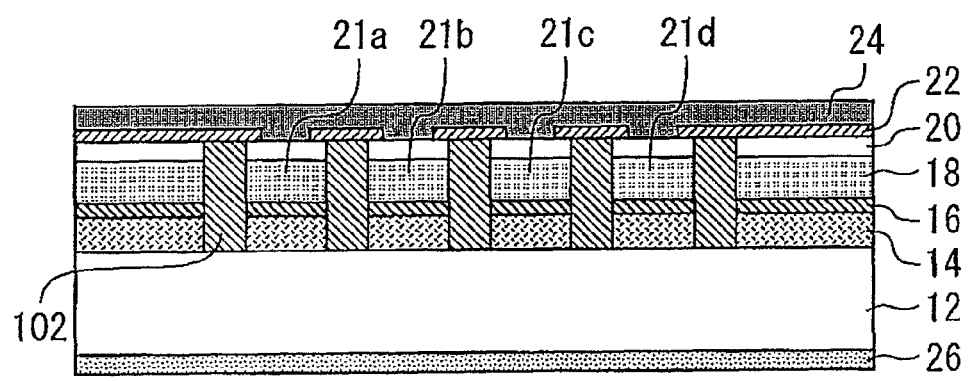
FIG. 9 is an elevational view of the semiconductor laser device of the second embodiment.

The following description of a semiconductor laser device in accordance with a second embodiment of the present invention will be primarily limited to the differences from the semiconductor laser device of the first embodiment. FIG. 9 is an elevational view of the semiconductor laser device of the second embodiment. The ridge stripes 21a, 21b, 21c, and 21d in this semiconductor laser device 100 are separated by proton-implanted portions 102 serving as separation sections. The proton-implanted portions 102 are formed after forming a lower cladding layer 14, an active layer 16, an upper cladding layer 18, and a contact layer 20 over the substrate 12, and by implanting protons so as to form stripe-shaped regions. Thus, the separation sections of the semiconductor laser device of the second embodiment can be easily formed by implantation of protons.

Third Embodiment

Figure 10:
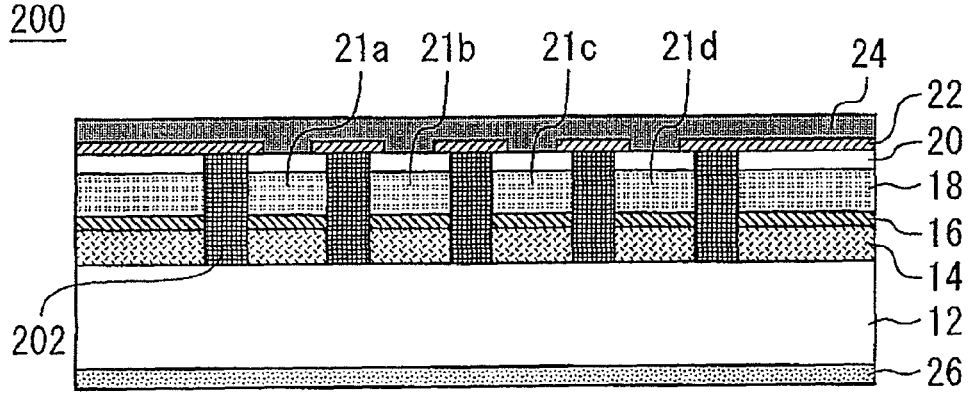
FIG. 10 is an elevational view of the semiconductor laser device of the third embodiment.

The following description of a semiconductor laser device in accordance with a third embodiment of the present invention will be primarily limited to the differences from the semiconductor laser device of the first embodiment. FIG. 10 is an elevational view of the semiconductor laser device of the third embodiment. The ridge stripes 21a, 21b, 21c, and 21d in this semiconductor laser device 200 are separated by impurity-diffused portions 202 serving as separation sections. The impurity-diffused portions 202 are formed after forming a lower cladding layer 14, an active layer 16, an upper cladding layer 18, and a contact layer 20 over the substrate 12, and by diffusing impurities so as to form stripe-shaped regions. Thus, the separation sections of the semiconductor laser device of the third embodiment can be easily formed by diffusion of impurities.

Fourth Embodiment

Figure 11:
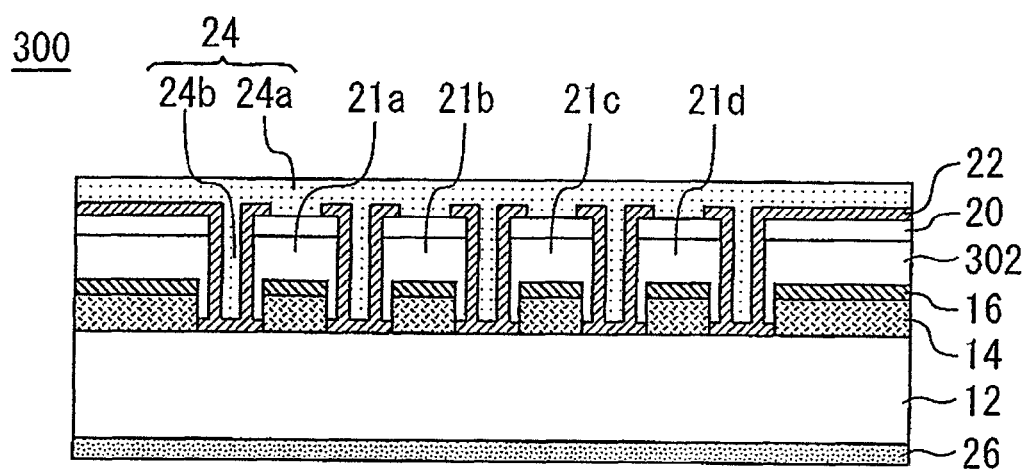
FIG. 11 is an elevational view of the semiconductor laser device of the fourth embodiment.

The following description of a semiconductor laser device in accordance with a fourth embodiment of the present invention will be primarily limited to the differences from the semiconductor laser device of the first embodiment. FIG. 11 is an elevational view of the semiconductor laser device of the fourth embodiment. In this semiconductor laser device 300, a plurality of upper cladding layers 302 are each formed to extend continuously on the top and sides of one of the active layers 16. The separation sections which separate the ridge stripes 21a, 21b, 21c, and 21d are each formed of a portion of the insulating film 22 and a portion (an inter-ridge portion 24b) of the top surface electrode 24.

Figure 12:
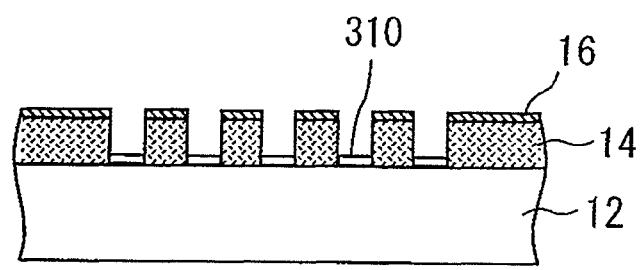
FIG. 12 is a cross-sectional view illustrating the method of manufacturing a semiconductor laser device in accordance with the fourth embodiment.

A method of manufacturing the semiconductor laser device 300 will be described. FIG. 12 is a cross-sectional view illustrating the method of manufacturing a semiconductor laser device in accordance with the fourth embodiment. The method begins by forming a plurality of stripe-shaped selective growth films 310 on the substrate 12. The selective growth films 310 are formed, e.g., of $SiO_2$. Next, the lower cladding layers 14 are selectively grown on the surface of the substrate 12 in areas where the selective growth films 310 have not been formed. That is, the lower cladding layers 14 are not formed on the selective growth films 310. The active layers 16 are then each formed on one of the lower cladding layers 14.

Figure 13:
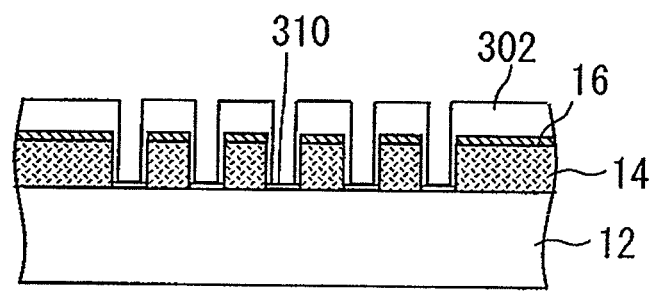
FIG. 13 is a cross-sectional view showing the upper cladding layers after they have been formed.

Next, the upper cladding layers are formed. FIG. 13 is a cross-sectional view showing the upper cladding layers after they have been formed. The upper cladding layers 302 are each grown on the top and sides of one of the active layers 16 and on the sides of the lower cladding layer 14 under that active layer 16, but are not grown on the selective growth films 310. The contact layers are then each selectively grown on one of the upper cladding layers 302. In this way, a plurality of ridge stripes are formed, each ridge stripe including a lower cladding layer, an active layer on the lower cladding layer, an upper cladding layer on the active layer, and a contact layer on the upper cladding layer.

An insulating film 22 is then formed to cover the sides of the ridge stripes in such a manner as to expose the contact layer at the top of each ridge stripe. Since the selective growth films 310 are formed of the same material as the insulating film 22, the selective growth films 310 become part of the insulating film 22. A top surface electrode 24 is then formed in contact with the contact layer 20 at the top of each ridge stripe and in contact with the insulating film 22 in such a manner as to fill the spaces between adjacent ridge stripes. Further, the bottom surface electrode 26 is formed, completing the manufacture of the semiconductor laser device shown in FIG. 11. The method of manufacturing a semiconductor laser device in accordance with the fourth embodiment enables the ridge stripes 21a, 21b, 21c, and 21d to be easily formed by means of selective growth.

Fifth Embodiment

A fifth embodiment of the present invention relates to a semiconductor laser array. Each of the semiconductor laser devices constituting this semiconductor laser array has the same structure as the semiconductor laser device 10 of the first embodiment.

Figure 14:
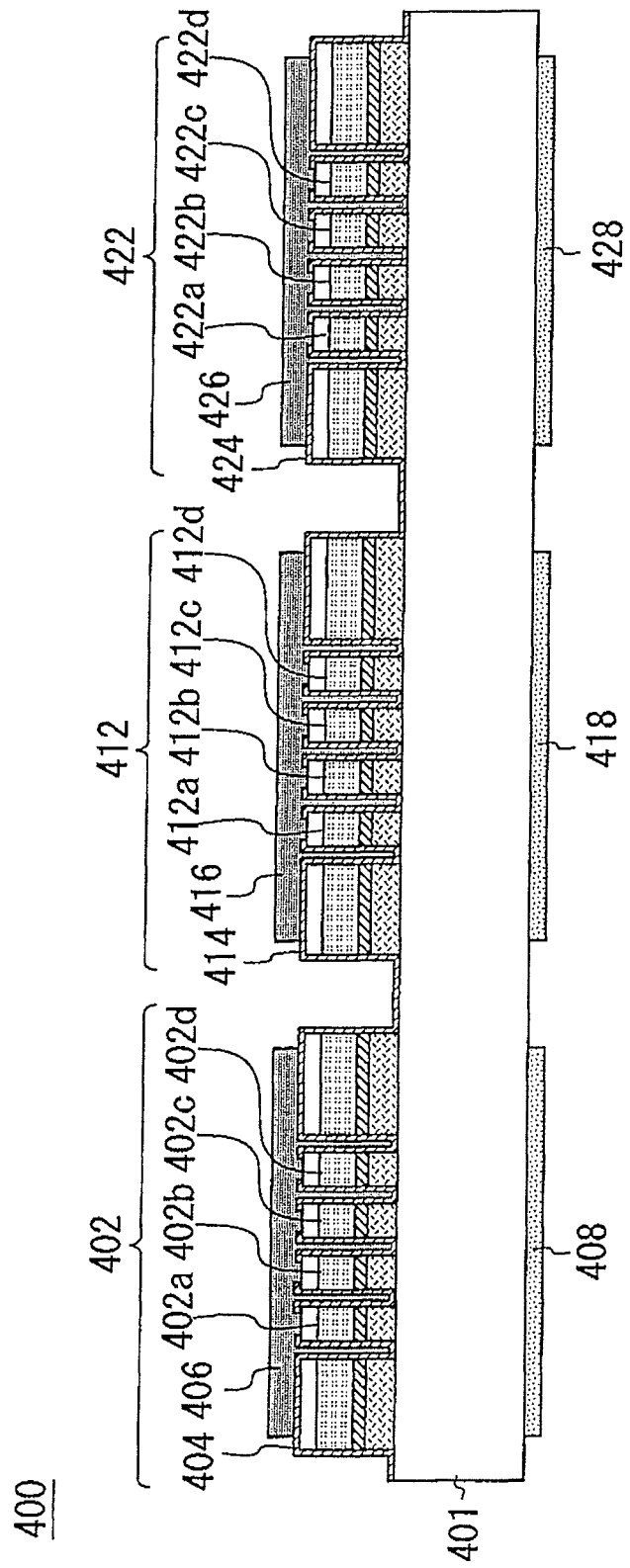
FIG. 14 is an elevational view of the semiconductor laser array of the fifth embodiment.

FIG. 14 is an elevational view of the semiconductor laser array of the fifth embodiment. The semiconductor laser array 400 has one substrate 401. A first semiconductor laser device 402, a second semiconductor laser device 412, and a third semiconductor laser device 422 are formed on the substrate 401. The first semiconductor laser device 402 has a plurality of first ridge stripes 402a, 402b, 402c, and 402d. The first ridge stripes 402a, 402b, 402c, and 402d are separated by first separation sections. A first top surface electrode 406 is formed on the first ridge stripes 402a, 402b, 402c, and 402d. A first bottom surface electrode 408 is formed on the bottom surface of the substrate 401 directly below the first top surface electrode 406. In the operation of the first semiconductor laser device 402, a voltage is applied between the first top surface electrode 406 and the first bottom surface electrode 408.

The second semiconductor laser device 412 has a plurality of second ridge stripes 412a, 412b, 412c, and 412d. The second ridge stripes 412a, 412b, 412c, and 412d are separated by second separation sections. A second top surface electrode 416 is formed on the second ridge stripes 412a, 412b, 412c, and 412d. A second bottom surface electrode 418 is formed on the bottom surface of the substrate 401 directly below the second top surface electrode 416. In the operation of the second semiconductor laser device 412, a voltage is applied between the second top surface electrode 416 and the second bottom surface electrode 418.

The third semiconductor laser device 422 has a plurality of third ridge stripes 422a, 422b, 422c, and 422d. The third ridge stripes 422a, 422b, 422c, and 422d are separated by third separation sections. A third top surface electrode 426 is formed on the third ridge stripes 422a, 422b, 422c, and 422d. A third bottom surface electrode 428 is formed on the bottom surface of the substrate 401 directly below the third top surface electrode 426. In the operation of the third semiconductor laser device 422, a voltage is applied between the third top surface electrode 426 and the third bottom surface electrode 428.

The semiconductor laser array 400 corresponds to an array of a plurality of the semiconductor laser devices 10 of the first embodiment. Incidentally, the multibeam semiconductor laser device disclosed in the above Japanese Laid-Open Patent Publication No. 2003-031905, which has a plurality of semiconductor laser devices therein, is disadvantageous in that, since each semiconductor laser device has only one active layer (that is, since each semiconductor laser device has only one ridge stripe), if a portion of an end face of a semiconductor laser device has been degraded, degradation may spread from that portion to the rest of the end face. In the case of the semiconductor laser array 400 of the fifth embodiment, on the other hand, this problem does not arise since each semiconductor laser device of the array has a plurality of ridge stripes formed therein. It should be noted that although in the above example the semiconductor laser array has three semiconductor laser devices, it may have any plurality of semiconductor laser devices.

Figure 15:
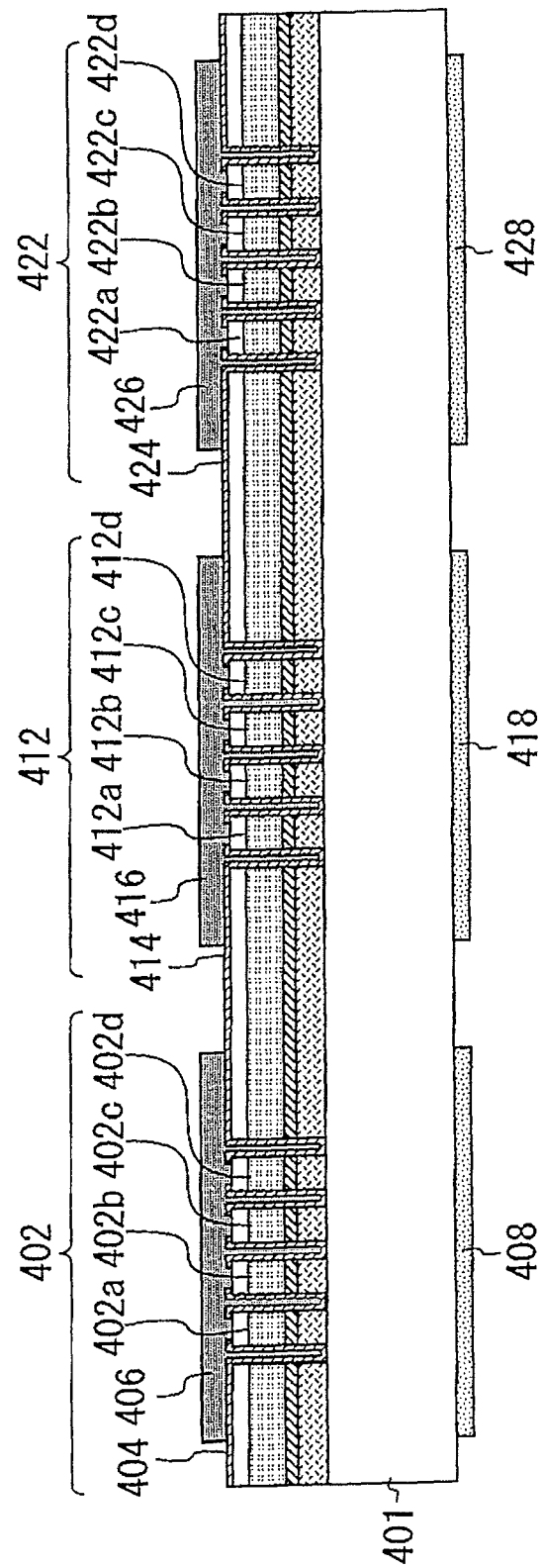
FIG. 15 is an elevational view of such a semiconductor laser array in which the active layers, etc. intermediate between the semiconductor laser devices have not been etched away.

In the above semiconductor laser array 400, the active layers, etc. intermediate between the semiconductor laser devices have been etched away. However, the present embodiment may be applied to a semiconductor laser array in which the active layers, etc. between the semiconductor laser devices are not etched away. FIG. 15 is an elevational view of such a semiconductor laser array in which the active layers, etc. intermediate between the semiconductor laser devices have not been etched away.

Features of the first to fifth embodiments may be applied to various types of semiconductor laser devices and semiconductor laser arrays. More specifically, although the above description of these embodiments does not describe the detailed structures of the epi layers, it is to be understood that the present invention may be applied to all types of semiconductor laser devices having a substrate, a buffer layer(s), a lower cladding layer, a light guiding layer(s), an active layer (of any type including QW, MQW, or SCH structure), an upper cladding layer, a band gap reduction layer, and/or a contact layer, etc.

The semiconductor laser devices of the second to fourth embodiments and the semiconductor laser array of the fifth embodiment are susceptible of alterations at least similar to those that can be made to the semiconductor laser device of the first embodiment. Further, features of embodiments described above may be combined where appropriate.

In accordance with the present invention, a plurality of ridge stripes are formed in a single semiconductor laser device, thereby preventing degradation from spreading from a degraded portion (if any) of an end face of the semiconductor laser device to the rest of the end face.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-060365, filed on Mar. 16, 2012, including specification, claims, drawings, and summary, on which the Convention priority of the present application is based, is incorporated herein by reference in its entirety.

What is claimed is:

1. A semiconductor laser device comprising:
   a substrate;
   a plurality of ridge stripes located on a first surface of said substrate, wherein
      adjacent pairs of said ridge stripes are separated from each other by respective separation sections, and
      a central one of said ridge stripes is wider than an outermost one of said ridge stripes;
   a top surface electrode extending continuously across said plurality of ridge stripes; and
   a bottom surface electrode located on a second surface of said substrate, opposite said first surface of said substrate, wherein each of said ridge stripes includes
      a lower cladding layer located on said first surface of said substrate,
      an active layer located on said lower cladding layer,
      an upper cladding layer located on said active layer, and
      a contact layer located on said upper cladding layer.

2. The semiconductor laser device according to claim 1, wherein each of said separation sections includes:
   an insulating film located on facing sides of adjacent pairs of said ridge stripes, and
   an inter-ridge portion in contact with said insulating film and filling the space between said adjacent pairs of said ridge stripes, wherein said inter-ridge portion is part of said top surface electrode.

3. A semiconductor laser comprising:
   a substrate;
   a plurality of ridge stripes located on a first surface of said substrate and extending along lengths of said ridge stripes, wherein
      adjacent pairs of said ridge stripes are separated from each other by respective separation sections,
      each separation section has a width that is transverse to the lengths of said ridge stripes, and
      a central one of said separation sections is wider than an outermost one of said separation sections;
   a top surface electrode extending continuously across said plurality of ridge stripes; and
   a bottom surface electrode located on a second surface of said substrate, opposite said first surface of said substrate, wherein each of said ridge stripes includes
      a lower cladding layer located on said first surface of said substrate,
      an active layer located on said lower cladding layer,
      an upper cladding layer located on said active layer, and
      a contact layer located on said upper cladding layer.

4. The semiconductor laser device according to claim 3, wherein each of said separation sections includes:
   an insulating film located on facing sides of adjacent pairs of said ridge stripes, and
   an inter-ridge portion in contact with said insulating film and filling the space between said adjacent pairs of said ridge stripes, wherein said inter-ridge portion is part of said top surface electrode.

5. A semiconductor laser device comprising:
   a substrate;
   a plurality of ridge stripes located on a first surface of said substrate and extending along lengths of said ridge stripes, between ends of said ridge stripes, wherein adjacent pairs of said ridge stripes are separated from each other by respective separation sections;
   a top surface electrode extending continuously across said plurality of ridge stripes; and
   a bottom surface electrode located on a second surface of said substrate, opposite said first surface of said substrate, wherein
      each of said ridge stripes includes
         a lower cladding layer located on said first surface of said substrate,
         an active layer located on said lower cladding layer,
         an upper cladding layer located on said active layer, and
         a contact layer located on said upper cladding layer,
      each ridge stripe has a width, when viewed in plan, perpendicular to said top surface of said semiconductor substrate, that is transverse to the length of said ridge stripe,
      the widths of said ridge stripes vary along the lengths of said ridge stripes, and
      the width of each ridge stripe is largest, along the length of said ridge stripe, at the ends of said ridge stripe.

6. The semiconductor laser device according to claim 5, wherein each of said separation sections includes:
   an insulating film located on facing sides of adjacent pairs of said ridge stripes, and
   an inter-ridge portion in contact with said insulating film and filling the space between said adjacent pairs of said ridge stripes, wherein said inter-ridge portion is part of said top surface electrode.

\* \* \* \* \*